US006200835B1

(12) United States Patent
Manning

(10) Patent No.: US 6,200,835 B1
(45) Date of Patent: *Mar. 13, 2001

(54) METHODS OF FORMING CONDUCTIVE POLYSILICON LINES AND BOTTOM GATED THIN FILM TRANSISTORS, AND CONDUCTIVE POLYSILICON LINES AND THIN FILM TRANSISTORS

(75) Inventor: Monte Manning, Kuna, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/406,201

(22) Filed: Sep. 27, 1999

Related U.S. Application Data

(63) Continuation of application No. 08/882,596, filed on Jun. 25, 1997, now Pat. No. 5,985,702, which is a continuation of application No. 08/566,653, filed on Dec. 4, 1995, now Pat. No. 5,658,807, which is a continuation of application No. 08/320,044, filed on Oct. 7, 1994, now abandoned.

(51) Int. Cl.[7] .................................................. H01L 21/00
(52) U.S. Cl. ...................... 438/158; 438/151; 438/149; 438/596
(58) Field of Search .................................. 438/158, 151, 438/149, 596

(56) References Cited

U.S. PATENT DOCUMENTS

| 4,479,831 | 10/1984 | Sandow et al. ...................... 148/1.5 |
|---|---|---|
| 4,716,131 | 12/1987 | Okazawa et al. ....................... 437/41 |
| 4,880,753 | 11/1989 | Meakin et al. ........................ 437/200 |
| 4,902,638 | 2/1990 | Muto . |
| 5,036,370 | 7/1991 | Miyago ..................... 357/4 |
| 5,060,029 | 10/1991 | Nishizawa et al. ................... 257/263 |
| 5,079,606 | 1/1992 | Yamamura et al. . |
| 5,252,502 | 10/1993 | Havemann ........................... 437/192 |
| 5,264,383 | 11/1993 | Young .................................... 437/40 |
| 5,264,728 | 11/1993 | Ikeda .................................... 257/761 |
| 5,266,507 | 11/1993 | Wu ......................................... 437/21 |
| 5,352,631 | 10/1994 | Sitaram et al. . |
| 5,495,119 | 2/1996 | Ikeuchi .................................. 257/72 |
| 5,658,807 | 8/1997 | Manning . |

OTHER PUBLICATIONS

S. Wolf et al., "Silicon Processing For The VLSI Era", vol. I, 1986, pp. 397–399, 179–180.
S. Wolf, "Silicon Processing For The VLSI Era", vol. II, 1992, pp. 144–147, 150–152, 358–359.

Primary Examiner—Richard Booth
Assistant Examiner—Viktor Simkovic
(74) Attorney, Agent, or Firm—Wells, St. John, Roberts, Gregory & Matkin, P.S.

(57) ABSTRACT

A semiconductor processing method of forming a conductive polysilicon line relative to a substrate includes, a) providing a line of silicon on a substrate, the line having an outer top surface and outwardly exposed opposing outer sidewall surfaces, the line ultimately comprising conductively doped polysilicon; b) masking the line outer top surface with a masking material; c) with the masking material in place, depositing a metal layer atop the substrate and over the masking material and the outwardly exposed line outer sidewall surfaces; d) annealing the line to impart a silicidation reaction between the metal and opposing silicon sidewalls to form opposing metal silicide runners extending along the line sidewalls, the masking material preventing a silicidation reaction from occurring between the metal and line outer top surface; and e) stripping the metal layer from atop the line. Such a line is preferably used as a bottom gate for a thin film transistor. The invention also includes conductive polysilicon lines and thin film transistors.

11 Claims, 3 Drawing Sheets

METHODS OF FORMING CONDUCTIVE POLYSILICON LINES AND BOTTOM GATED THIN FILM TRANSISTORS, AND CONDUCTIVE POLYSILICON LINES AND THIN FILM TRANSISTORS

RELATED PATENT DATA

This patent is a continuation application of U.S. patent application Ser. No. 08/882,596, which was filed on Jun. 25, 1997, now U.S. Pat. No. 5,985,702, which is a continuation of U.S. patent application Ser. No. 08/566,653, filed on Dec. 4, 1995, now issued U.S. Pat. No. 5,658,807, which was a File Wrapper Continuation application of U.S. patent application Ser. No. 08/320,044, filed Oct. 7, 1994, abandoned.

This invention was made with Government support under Contract No. MDA972-92-C-0054 awarded by Advanced Research Projects Agency (ARPA). The Government has certain rights in this invention.

TECHNICAL FIELD

This invention relates to semiconductor processing methods of forming conductive polysilicon lines, to forming bottom gated thin film transistors, and to semiconductor apparatus and to bottom gated thin film transistors.

BACKGROUND OF THE INVENTION

This invention grew out of needs associated with bottom gated thin film transistors (TFTs) utilizing conductive polysilicon as the gate material. In these and other semiconductor applications, it is desirable to provide a smooth surface, high conductivity, low topology conductive interconnect utilizing an outer layer of polysilicon. For example in a bottom gated TFT, the outer gate surface is ideally as smooth as possible to minimize asperities that can undesirably cause high electric field regions in the subsequently thin deposited dielectric layer. These high field regions can later cause early breakdown voltages of the gate dielectric.

The conductive bottom gate of a thin film transistor typically comprises a line of polycrystalline material, usually polysilicon. While electrically conductive, conductively doped polysilicon has considerably higher resistance than other possible materials, such as metal. Polycrystalline materials are, however, materials of choice due to their ability to withstand subsequent high temperature processing steps inherently found in semiconductor wafer fabrication. Conductivity in a polysilicon line can be increased by increasing the thickness of the line or by maximized doping with conductivity enhancing impurities. Typically the polysilicon is provided with its maximum practical doping, however, as increasing thickness undesirably increases topology and therefor reduces process margins at subsequent photo and etch steps.

Another prior art method of increasing the conductance in a polysilicon line is to provide a layer of metal silicide on the outer top surface of the line. Such materials have considerably higher conductivity than conductively doped polysilicon, thereby maximizing the overall conductance of a polysilicon line. This technique is impractical, however, where the outer surface of the polysilicon line is to be utilized as a gate electrode for a thin film transistor. Most desirably, the interface between the conductive line and gate dielectric constitutes polysilicon having a very smooth surface interface between the gate is dielectric and line. Provision of silicide would defeat this purpose.

It would be desirable to overcome these and other problems associated with the prior art processes and constructions. While the invention was motivated by processes associated principally with TFT formation, the artisan will appreciate that aspects of the invention have applicability to other methods and constructions. The invention is intended to be limited only by the accompanying claims appropriately interpreted in accordance with the Doctrine of Equivalents.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
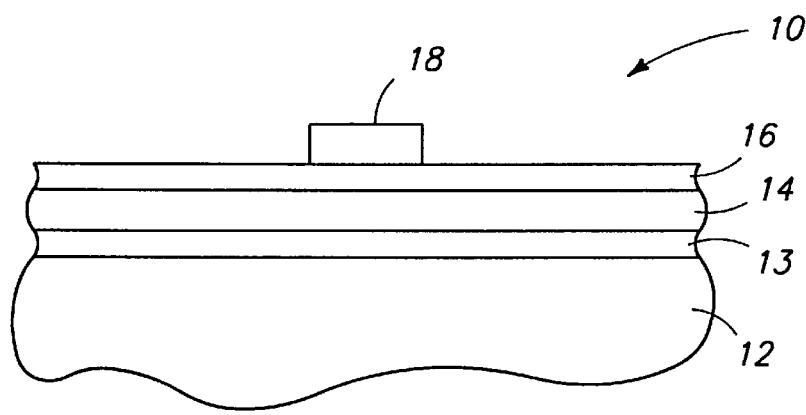
FIG. 1 is a diagrammatic section of a wafer at one processing step in accordance with the invention.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming a conductive polysilicon line relative to a substrate comprises the following steps:

providing a line of silicon on a substrate, the line having an outer top surface and outwardly exposed opposing outer sidewall surfaces, the line ultimately comprising conductively doped polysilicon;

masking the line outer top surface with a masking material;

with the masking material in place, depositing a metal layer atop the substrate and over the masking material and the outwardly exposed line outer sidewall surfaces;

annealing the line to impart a silicidation reaction between the metal and opposing silicon sidewalls to form opposing metal silicide runners extending along the line sidewalls, the masking material preventing a silicidation reaction from occurring between the metal and line outer top surface; and stripping the metal layer from atop the line.

In accordance with another aspect of the invention, a semiconductor processing method of forming a bottom gated thin film transistor comprises the following steps:

providing a bottom gate line of silicon on a substrate, the line having an outer top gating surface and outwardly exposed opposing outer sidewall surfaces, the line ultimately comprising conductively doped polysilicon;

masking the line outer top surface with a masking material;

with the masking material in place, depositing a metal layer atop the substrate and over the masking material and the outwardly exposed line outer sidewall surfaces;

annealing the line to impart a silicidation reaction between the metal and opposing silicon sidewalls to form opposing metal silicide runners extending along the line sidewalls, the masking material preventing a silicidation reaction from occurring between the metal and line outer top surface;

stripping the masking material and metal layer from atop the line to outwardly expose the line outer top gating surface;

providing a gate dielectric layer over the outer top gating surface;

providing a thin film transistor layer over the gate dielectric layer; and providing a source and drain within the thin film transistor layer.

In accordance with still a further aspect of the invention, a semiconductor apparatus comprises:

a substrate;

a conductively doped polysilicon line lying atop the substrate, the line having an outer top surface and opposing outer sidewalls; and at least ore of the sidewalls comprising a conductivity enhancing metal sulicide covering, a predominant portion of the sidewall and running along the line.

Yet in still a further aspect of the invention, a bottom gated thin film transistor comprises:

a substrate:

a conductively doped polysilicon bottom gate line lying atop the substrate, the bottom gate line having an outer top gating surface and opposing outer sidewalls;

a gate dielectric layer lying atop the bottom rate outer top gating surface;

a thin film transistor layer lying atop the gate dielectric layer, the thin film transistor layer comprising a source region, a drain region, and a channel region lying intermediate the source region and the drain region; and the bottom gate line sidewalls comprising a conductivity enhancing metal silicide covering a predominant portion of the sidewalls and running along the line.

More particularly, and first with reference to FIGS. 1–7, a semiconductor wafer fragment at one processing step in accordance with the invention is indicated generally with reference numeral 10. Fragment 10 comprises a bulk substrate 12 and an insulating oxide layer 13. Provided there atop are an overlying layer of silicon material 14, a subsequently deposited layer of oxide 16 (i.e., silicon dioxide deposited by decomposition of tetraethylorthosilicate) and overlying patterned photoresist layer 18. Example thicknesses of layers 14 and 16 are 2000 Angstroms and 200 Angstroms, respectively. Layer 13 is provided sufficiently thick to provide electrical isolation from bulk substrate 12.

Figure 2:
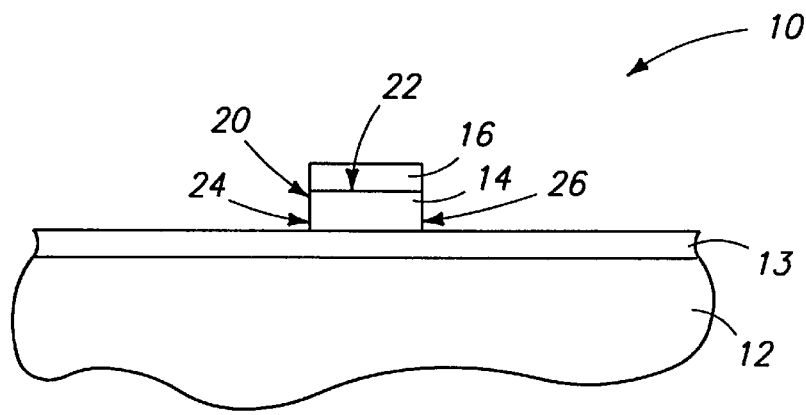
FIG. 2 is a view of the FIG. 1 wafer fragment at a processing step subsequent to that shown by FIG. 1.

Layers 16 and 14 are chemically etched to produce a line 20 of silicon on substrate 12 (FIGS. 2). Photoresist 18 is stripped from the wafer. In accordance with the invention, silicon layer 14 will ultimately comprise conductively doped polysilicon, although line 14 may not have this composition at this portion of the process. For purposes of the continuing discussion, silicon line 20 has an outer top surface 22 and outwardly exposed opposing outer sidewall surfaces 24 and 26. Material 16 masks line outer top surface 22.

In accordance with the described preferred embodiment, ideally line outer surface 22 is provided with as smooth a surface as possible for use as an outer top gating surface of a bottom gate for a thin film transistor. This is facilitated by providing layer 14 initially as amorphous silicon deposited at a suitable low temperature of 540° C. or lower and at a pressure of from 200 to 800 mTorr, such that layer 14 as-deposited is amorphous. A subsequent crystallization anneal step will transform layer 14 into polycrystalline silicon wherein outer surface 22 is considerably smoother than were layer 14 polysilicon as-deposited. An example crystallization anneal step includes subjecting the wafer to 600° C. for 24 hours and atmospheric pressure. Alternately and more typically, the transformation from the amorphous phase to the polycrystalline phase will naturally occur during subsequent wafer processing steps which subject the wafer to elevated temperatures effective to impart the phase change.

Although the preferred described embodiment is in the context of forming a bottom gated thin film transistor having a bottom gate line of polysilicon, the artisan will appreciate that other semiconductor apparatus and methods of forming a conductively doped polysilicon line are contemplated. In such event, there may not be any particular desire to provide outer top surface 22 to be smooth, such that direct deposition of a polysilicon layer and subsequent patterning thereof would be adequate. Additionally and regardless of the final construction, layer 14/line 20 could be conductively doped at substantially any portion in the process subject to the processor's desires.

Figure 3:
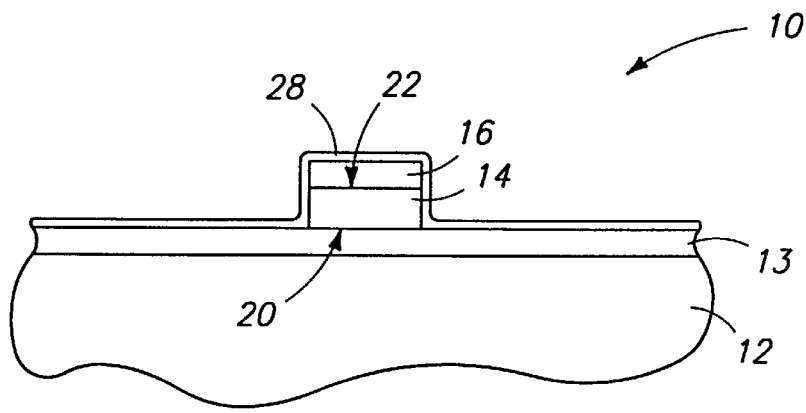
FIG. 3 is a view of the FIG. 1 wafer fragment at a processing step subsequent to that shown by FIG. 2.

Referring to FIG. 3 and with masking material 16 in place, a metal layer 28 is deposited atop substrate 12 and over masking material 16 and outwardly exposed line outer sidewall surfaces 24 and 26. Example metals for layer 28 include cobalt, titanium, tungsten and platinum, or other suitable metal. Cobalt is a preferred material in thin film transistor fabrication in an effort to minimize "horn" formation at the top or outer edges.

Figure 4:
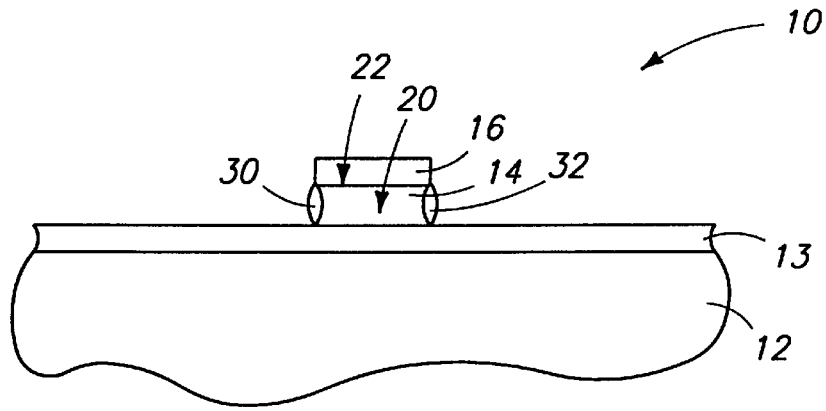
FIG. 4 is a view of the FIG. 1 wafer fragment at a processing step subsequent to that shown by FIG. 3.
Figure 5:
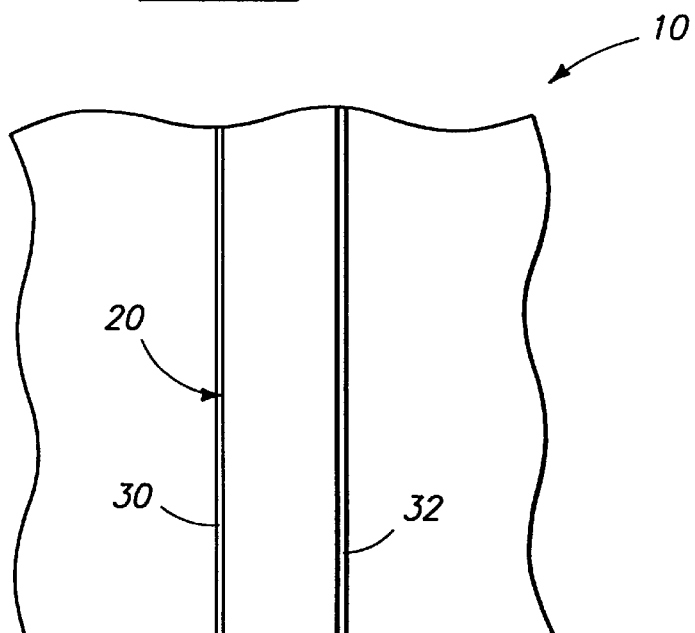
FIG. 5 is a top view of the FIG. 4 wafer fragment.

The wafer and correspondingly line 20 are thereafter annealed to impart a silicidation reaction between metal 28 and opposing silicon sidewalls 24 and 26. This will transform such sidewalls into opposing metal silicide runners 30 and 32 extending along the line sidewalls (FIGS. 4 and 5). Example reaction conditions to impart such reaction include 700° C. for 30 seconds in an inert atmosphere. Masking material 16 prevents a silicidation reaction from,n occurring between metal 28 and line outer top surface 22 (FIG. 3). Further, layer 13 is provided to present a silicidation reaction from otherwise occurring between metal layer 28 and bulk substrate 12, which would typically constitute monocrystalline silicon. Accordingly, a predominant portion (i.e., greater than 50%) of sidewalls 24 and 26 (FIG. 2) are covered by conductivity enhancing metal silicide 30 and 32 (FIGS. 4 and 5) which runs along line 20. In the illustrated and preferred embodiment, the entirety of the respective sidewalls are covered by metal silicide from where line 20 joins with its underlying substrate to where the sidewalls join with outer top surface 22. Further, very little if any of outer top surface 22 comprises metal silicide, as such surface will subsequently preferably be utilized as a gating surface for a thin film transistor. The only silicide provided atop surface 22 is preferably only at the very outer side edges of outer surface 22. Accordingly, a predominant portion of outer top surface 22 does not comprise metal silicide.

Figure 6:
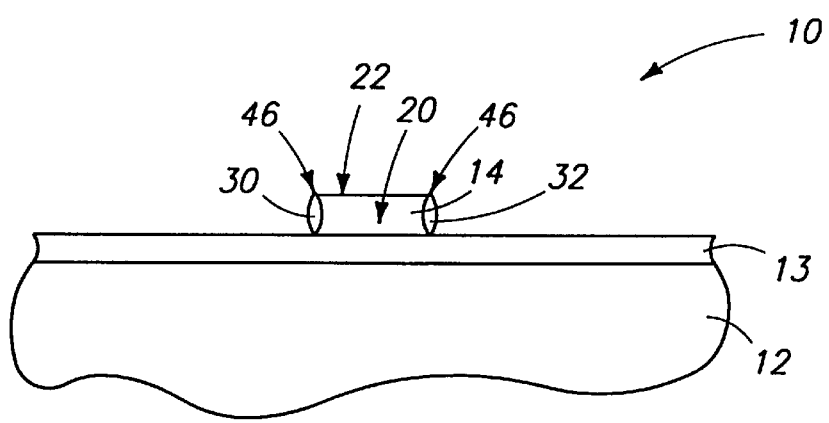
FIG. 6 is a view of the FIG. 1 wafer fragment at a processing step subsequent to that shown by FIGS. 4 and 5.

Referring to FIG. 6, masking material 16 and unreacted metal layer 28 are stripped from atop the line to outwardly expose line outer top gating surface 22. The preferred method is by first stripping unreacted metal from the oxide masking material and from the substrate, and then subsequently stripping the oxide masking material from line 20.

Figure 7:
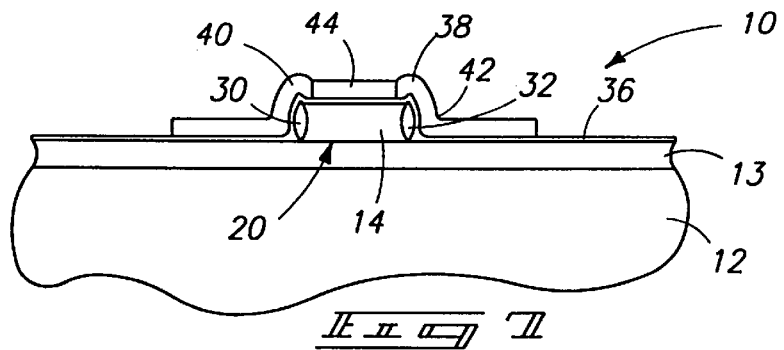
FIG. 7 is a view of the FIG. 1 wafer fragment at a processing step subsequent to that shown by FIG. 6.

Referring to FIG. 7, a gate dielectric layer 36 is provided over the substrate and atop outer top gating surface 22. Such typically and preferably comprises silicon dioxide posited to a thickness of 200 Angstroms. Subsequently, a thin film transistor layer 38 is provided over gate dielectric layer 36. A typical and preferred material is n-type conductively doped polysilicon. Source and drain regions 40 and 42, respectively, as well as an intervening channel region 44 are provided within thin film layer 38 to essentially complete construction of a thin film transistor.

Such a construction provides the added advantage of overall increasing the conductivity of polysilicon line 20 by the provision of silicide strips 30 and 32 along the line, while leaving the gating surface as a smooth outer surface of polysilicon. The artisan will appreciate that the invention has applicability to conductive polysilicon lines other than bottom gate lines for thin film transistors. Conductive polysilicon lines in accordance with the invention, only as limited by the accompanying claims, might be provided to have only one of the opposing sidewalls with a metal sulicide runner.

Figure 8:
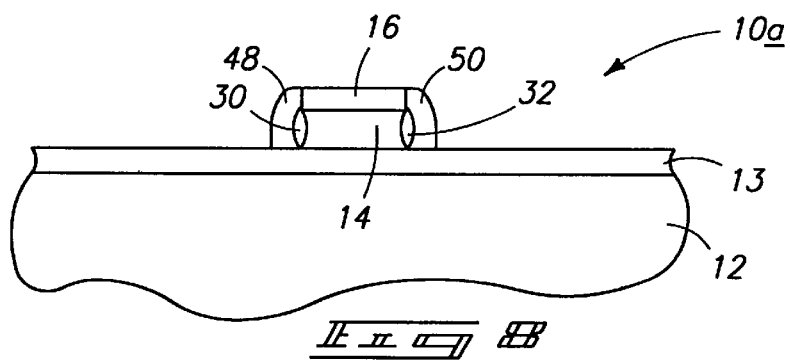
FIG. 8 is a view of the FIG. 1 wafer fragment, but shown as an alternate embodiment employing an alternate processing step subsequent to that shown by FIG. 4.

An alternate processing sequence and construction 10a in accordance with the invention is described with reference to FIGS. 8–10. FIG. 8 would be a processing step occurring subsequent to that shown by FIG. 4. One potential drawback with respect to the first-described construction is the possible provision of sharp conductive points 46 (FIG. 6) occurring at the tops of silicide runners 30 and 32. These sharp points will potentially provide undesired electric field breakdown in the dielectric field of the resultant finished thin film transistor construction. Sharp points created by insulating material would, however, not result in such voltage breakdown. FIG. 8 illustrates the provision of an insulating layer to a thickness of, for example, 1500 Angstroms, and subsequent anisotropic spacer etching thereof to produce the illustrated sidewall spacers 48 and 50. An example and preferred material for spacers 48 and 50 would be an insulative nitride, such as silicon nitride.

Figure 9:
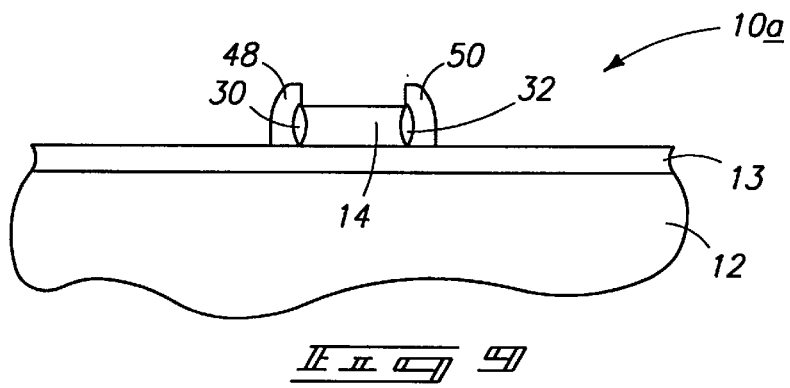
FIG. 9 is a view of the FIG. 8 wafer fragment at a processing step subsequent to that shown by FIG. 8.

Thereafter as shown in FIG. 9, masking material 16 is removed. Spacers 48 and 50 effectively cover the previous formed sharp conductive points 46.

Figure 10:
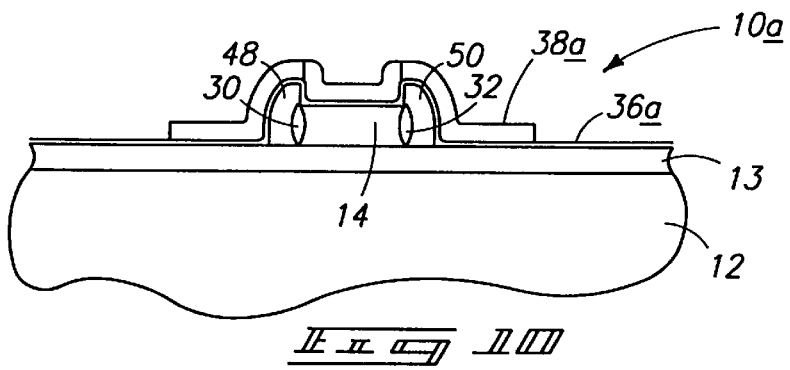
FIG. 10 is a view of the FIG. 8 wafer fragment at a processing step subsequent to that shown by FIG. 9.

Referring to FIG. 10, the subsequently deposited dielectric layer 36a and thin film transistor layer 38a accordingly are not adversely impacted by the previous sharp points 46 (FIG. 6). Any sharp points created by the outermost portions of spaces 48 and 50 are immaterial or have no effect to the breakdown effect described above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method comprising:
    forming a conductively doped polysilicon line over a bulk semiconductor substrate, the line having outwardly exposed opposing outer sidewall surfaces;
    forming opposing metal silicide runners extending along the line outer sidewall surfaces, the metal silicide runners having top surfaces; and
    forming insulating spacers over the silicide runners, the insulating spacers covering the metal silicide runner top surfaces.

2. The semiconductor processing method of claim 1 wherein the metal silicide runners comprise cobalt.

3. The semiconductor processing method of claim 1 wherein the step of forming a line comprises deposition of a layer of amorphous silicon and subsequent processing of the amorphous silicon to convert the amorphous silicon into a polycrystalline silicon line.

4. A semiconductor processing method comprising:
    forming an electrically conductive line of material on a substrate, the line having outwardly exposed opposing outer sidewall surfaces;
    forming opposing metal silicide runners extending along the line outer sidewall surfaces; and
    forming insulating spacers consisting essentially of silicon nitride over the metal silicide runners.

5. The method of claim 4 further comprising:
    forming a dielectric layer over the line;
    forming a thin film transistor layer over the dielectric layer and over the insulating spacers; and
    forming source and drain regions within the thin film transistor layer.

6. The method of claim 4 wherein the metal silicide runners comprise cobalt.

7. A semiconductor processing method of forming a bottom gated thin film transistor comprising the following steps:
    providing a bottom gate line of silicon on a substrate, the line having an outer top gating surface and outwardly exposed opposing outer sidewall surfaces;
    forming opposing metal silicide runners extending along the line sidewalls, the opposing metal silicide runners not extending across the outer top gating surface;
    forming a dielectric layer over the outer top gating surface;
    forming a thin film transistor layer over the dielectric layer; and
    forming source and drain regions within the thin film transistor layer.

8. The method of claim 7 wherein the metal silicide runners comprise cobalt.

9. The method of claim 7 further comprising, before forming the thin film transistor layer, forming insulative spacers over the metal silicide runners.

10. A thin film semiconductor processing method of forming a bottom gated thin film transistor having reduced surface interface roughness between a gate dielectric layer and a bottom gate line of silicon, the method comprising the following steps:
    providing a bottom gate line of silicon on a substrate, the line having an outer top gating surface and outwardly exposed opposing outer sidewall surfaces, the line ultimately comprising conductively doped polysilicon;
    forming a metal layer over the outwardly exposed line outer sidewall surfaces, said metal layer not in contact with the outer top gating surface;
    annealing the line sufficiently to form opposing metal silicide runners extending along the line sidewalls;
    forming a gate dielectric layer over the outer top gating surface;

forming a thin film transistor layer over the gate dielectric layer; and forming a source region and a drain region within the thin film transistor layer.

11. A thin film semiconductor processing method of forming a bottom gated thin film transistor comprising:

forming a bottom gate line of silicon on a substrate, the line having an outer top gating surface and outwardly exposed opposing outer sidewall surfaces, the line ultimately comprising conductively doped polysilicon;

masking the line outer top surface with a masking material;

with the masking material in place, depositing a metal layer atop the substrate and over the masking material and the outwardly exposed line outer sidewall surfaces, but not in contact with the outer top gating surface;

reacting the metal and opposing silicon sidewalls to form opposing metal silicide runners extending along the line sidewalls, the masking material preventing a silicidation reaction from occurring between the metal and line outer top surface;

stripping the masking material and metal layer from atop the line to outwardly expose the line outer top gating surface;

forming a gate dielectric layer over the outer top gating surface to form a smoother surface interface between the gate dielectric and the bottom gate line of silicon than would otherwise occur had the metal layer been in contact with the outer top gating surface;

forming a thin film transistor layer over the gate dielectric layer; and forming a source region and a drain region within the thin film transistor layer.

* * * * *

UNITED STATES PATENT AND TRADEMARK OFFICE
CERTIFICATE OF CORRECTION

PATENT NO. : 6,200,835 B1
DATED : March 13, 2001
INVENTOR(S) : Monte Manning

It is certified that error appears in the above-identified patent and that said Letters Patent is hereby corrected as shown below:

<u>Title page, item [57],</u>
Abstract, replace "preventing a'silicidation" with -- preventing a silicidation --.

<u>Column 3,</u>
Line 15, replace "laver" with -- layer --.
Line 31, replace "ore" with -- one --.
Line 32, replace "sulicide" with -- silicide --.
Line 36, replace ":" with -- ; --.
Line 40, replace "rate" with -- gate --.

<u>Column 4,</u>
Line 49, replace "from,n" with -- from --.
Line 51, replace "present" with -- prevent --.

<u>Column 5,</u>
Line 9, replace "posited" with -- deposited --.
Line 26, replace "sulicide" with -- silicide --.

Signed and Sealed this

Sixteenth Day of October, 2001

Attest:

*Nicholas P. Godici*

NICHOLAS P. GODICI
*Attesting Officer*     *Acting Director of the United States Patent and Trademark Office*